US011641072B2

(12) United States Patent
Pan et al.

(10) Patent No.: US 11,641,072 B2
(45) Date of Patent: May 2, 2023

(54) PCB-PINOUT BASED PACKAGED MODULE AND METHOD FOR PREPARING PCB-PINOUT BASED PACKAGED MODULE

(71) Applicant: Huawei Technologies Co., Ltd., Shenzhen (CN)

(72) Inventors: Weijian Pan, Shanghai (CN); Zhixiang Hu, Dongguan (CN); Dan Yang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 148 days.

(21) Appl. No.: 17/327,297

(22) Filed: May 21, 2021

(65) Prior Publication Data

US 2021/0280998 A1 Sep. 9, 2021

Related U.S. Application Data

(63) Continuation of application No. PCT/CN2019/110169, filed on Oct. 9, 2019.

(30) Foreign Application Priority Data

Nov. 23, 2018 (CN) .......................... 201811412943.X (51) Int. Cl.
*H01R 12/00* (2006.01)
*H01R 12/70* (2011.01)
(Continued)

(52) U.S. Cl.
CPC ..... *H01R 12/7005* (2013.01); *H01R 12/7088* (2013.01); *H01R 12/732* (2013.01); *H05K 3/0017* (2013.01); *H05K 3/045* (2013.01)

(58) Field of Classification Search
CPC ............ H01R 13/6658; H01R 13/5216; H01R 12/57; H01R 13/506
See application file for complete search history.

(56) References Cited

U.S. PATENT DOCUMENTS 3,179,921 A * 4/1965 Arthur .................. G06F 11/076
377/126
5,562,496 A * 10/1996 Benjamin ............ H01R 12/707
439/108
(Continued)

FOREIGN PATENT DOCUMENTS

CN 101238576 A 8/2008
CN 101533825 A 9/2009
(Continued)

*Primary Examiner* — Phuong Chi Thi Nguyen
(74) *Attorney, Agent, or Firm* — Leydig, Voit & Mayer, Ltd.

(57) ABSTRACT

This application relates to the field of power supply packaging technologies, and in particular, to a PCB-pinout based packaged module, including a packaged module and a pin exposed outside the packaged module. The packaged module includes a PCB and a power component. The PCB has a first surface and a second surface that are disposed opposite to each other, and the power component is disposed on the first surface or the second surface of the PCB. The power component performs communication connection with a pin located on one side of the first surface or one side of the second surface of the PCB through surface-layer copper of the PCB. The pin located on one side of the first surface or one side of the second surface of the PCB is a surface-layer copper etching pattern that is located on the PCB and that is exposed outside the packaged module.

11 Claims, 5 Drawing Sheets

(51) Int. Cl.
    *H01R 12/73*     (2011.01)
    *H05K 3/00*     (2006.01)
    *H05K 3/04*     (2006.01)

(56) References Cited

U.S. PATENT DOCUMENTS

| | | | | |
|---|---|---|---|---|
| 5,897,384 | A | * | 4/1999 | Hosier, Sr. ............. H01R 24/50 |
| | | | | 439/63 |
| 6,079,986 | A | * | 6/2000 | Beshears ................ H01R 12/52 |
| | | | | 439/63 |
| 11,289,855 | B2 | * | 3/2022 | Wada ................ H01R 43/0256 |
| 2017/0162481 | A1 | | 6/2017 | Lin et al. |
| 2019/0006326 | A1 | | 1/2019 | Jiang et al. |

FOREIGN PATENT DOCUMENTS

| | | | |
|---|---|---|---|
| CN | 201887040 | U | 6/2011 |
| CN | 103531549 | A | 1/2014 |
| CN | 105870300 | A | 8/2016 |
| CN | 106783817 | A | 5/2017 |
| CN | 109712955 | A | 5/2019 |
| EP | 1672972 | A1 | 6/2006 |
| KR | 100913171 | B1 | 8/2009 |
| WO | 2013180092 | A1 | 12/2013 |
| WO | 2014023457 | A1 | 2/2014 |
| WO | 2018095043 | A1 | 5/2018 |

\* cited by examiner

PCB-PINOUT BASED PACKAGED MODULE AND METHOD FOR PREPARING PCB-PINOUT BASED PACKAGED MODULE

CROSS-REFERENCE TO RELATED APPLICATIONS

This application is a continuation of International Application No. PCT/CN2019/110169, filed on Oct. 9, 2019, which claims priority to Chinese Patent Application No. 201811412943.X, filed on Nov. 23, 2018. The disclosures of the aforementioned applications are hereby incorporated by reference in their entireties.

TECHNICAL FIELD

This application relates to the field of power packaging technologies, and in particular, to a PCB-pinout based packaged module and a method for preparing the PCB-pinout based packaged module.

BACKGROUND

With rapid development of science and technology, electronic devices such as a mobile phone and a tablet computer have been popularized. To improve product performance and key competitiveness, electronic device manufacturers impose a higher requirement, for example, plastic packaging, on a power module of an electronic device. In addition to improving the plastic packaging requirement for the power module, the electronic device can be applied to a plurality of scenarios, so that environment adaptability of the power module is improved, and anti-corrosion coating is unnecessary. A high-conductive plastic packaging material is used to implement double-sided conduction heat dissipation, to improve heat dissipation performance and power density. In addition, a solid insulation manner is further provided to improve assembly density and achieve high pressure resistance performance of the power module. In addition, as one of heat dissipation paths of the power module, a pin that is led out is an indispensable part for electrically connecting the power module to an external printed circuit board (PCB).

With a continuous increase in power density of a PCB-based power module, development moves from a conventional open frame module to a plastic-packaged module. However, a plastic packaging process (e.g., a design of a plastic packaging mold) has many restrictions on a pinout of the plastic-packaged module. The plastic-packaged module is less flexible compared with the conventional open frame module. A pin assembly with a specific structure needs to be processed, and a signal or power lead-out point needs to be soldered to the module by means such as reflow soldering. However, in this method, costs are high, pin strength is low, a module size is increased, and the module is subject to thermal shock, which affects reliability.

Figure 1:
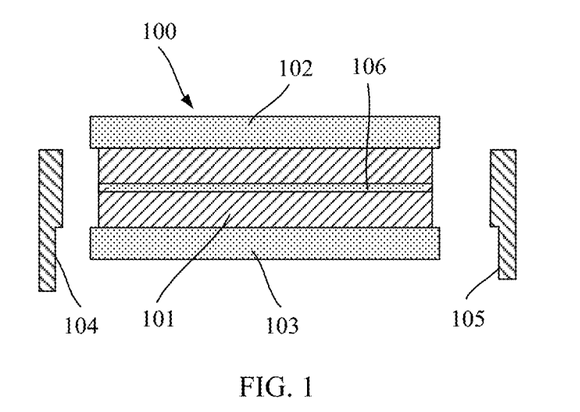
FIG. 1 is a schematic structural diagram of a packaged module in the conventional technology.

As shown in a structure in FIG. 1, in the conventional technology, both sides of a power module have a pinout horizontal structure. A plastic part and a metal pin of a pin assembly need to be separately manufactured by opening molds, and a structure similar to a connector is assembled. Laser or hot air reflow soldering is performed on a power or signal lead-out point on a plastic-packaged module PCB by using a material such as a solder pad or solder paste. Specifically, as shown in the structure in FIG. 1, in the conventional technology, a connection manner between a pin of a power supply packaged module and a substrate is as follows: the power supply module 100 includes the substrate 101, a plastic packaging layer 102, a plastic packaging layer 103, a pin 104, a pin 105, and an interconnection layer 106. The substrate 101 is plastically packaged by the plastic packaging layer 102 and the plastic packaging layer 103. The power supply packaged module 100 needs to be provided with grooves for soldering the pin 104 and the pin 105 on both sides of the substrate 101, and needs to use a relatively complex process such as reflow soldering. In addition, when the substrate 101 is packaged by the plastic packaging layer 102 and the plastic packaging layer 103, positions for disposing jacks corresponding to the pin 104 and the pin 105 need to be reserved. This is inconvenient for implementing product packaging. In addition, the solution increases a volume of the plastic-packaged module.

It can be seen that, a mold for the plastic part and a mold for the pin need to be separately opened for the pin assembly of the power module in the conventional technology, resulting in high costs and a complex processing process. A process such as lead-free hot air reflow soldering or laser reflow soldering needs to be used to assemble the pin and the plastic-packaged module PCB. In an assembly process, a special fixture is required to clamp the pin and the plastic-packaged module. In addition, the plastic-packaged module is subject to the thermal shock in the assembly process. This affects performance and reliability of the module, and the pin assembly also increases dimensions of the plastic-packaged module in a horizontal direction.

SUMMARY

This application provides a PCB-pinout based packaged module and a method for preparing the PCB-pinout based packaged module. The packaged module is disposed in a PCB-pinout manner, to resolve a problem in the conventional technology that a volume of the packaged module is large and a pin soldering process of the packaged module is complex, so that the packaged module has a small volume, and a pin disposing process is simple.

According to a first aspect, a PCB-pinout based packaged module is provided, including a packaged module and a pin exposed outside the packaged module. The packaged module includes a PCB and a power component. The PCB has a first surface and a second surface that are disposed opposite to each other, and the power component is disposed on the first surface or the second surface of the PCB.

The power component performs communication connection with a pin located on one side of the first surface or one side of the second surface of the PCB through surface-layer copper of the PCB.

The pin located on one side of the first surface or one side of the second surface of the PCB is a surface-layer copper etching pattern that is located on the PCB and that is exposed outside the packaged module.

With reference to the first aspect, in a first possible implementation, the surface-layer copper etching pattern that is of the pin and that is used in the packaged module is entirely exposed outside the packaged module.

With reference to the first aspect and the first possible implementation, in a second possible implementation, there are two or more pins, and the PCB between the two or more pins is provided with an opening to form at least one sprue.

With reference to the second possible implementation, in a third possible implementation, there is one sprue, or there may be two or a plurality of left and right symmetric/asymmetric sprues.

With reference to the first aspect and the first possible implementation, in a fourth possible implementation, a heat-resistant film is disposed on the pin, to prevent the pin from being damaged in a packaging process.

With reference to the first aspect and the first possible implementation, in a fifth possible implementation, the packaged module is a communications power supply packaged module.

With reference to the first aspect and the first possible implementation, in a sixth possible implementation, the packaged module may be configured to be cut into at least two independent sub-packaged modules based on a function or a structure of the power component, and each of the at least two independent sub-packaged modules includes at least one pin exposed outside the packaged sub-module.

According to a second aspect, a method for manufacturing a PCB-pinout based packaged module is provided, including:

etching surface-layer copper that is of a first surface or a second surface of the PCB and that is on an edge part of the PCB, to obtain more than two pins;

performing, by the power component, communication connection with a pin located on one side of the first surface or one side of the second surface of the PCB through the surface-layer copper of the PCB, where the pin located on one side of the first surface or one side of the second surface of the PCB is a surface-layer copper etching pattern that is located on the PCB and that is exposed outside the packaged module; and packaging the PCB and the power component, and exposing the more than two pins outside the packaged module.

With reference to the second aspect, in a first possible implementation, the packaging the PCB and the power component, and exposing the more than two pins outside the packaged module specifically includes:

packaging the PCB and the power component, and exposing, entirely outside the packaged module, the surface-layer copper etching pattern that is located on the PCB and that is exposed outside the packaged module, where the surface-layer copper etching pattern that is exposed outside the packaged module is more than two pins of the packaged module.

With reference to the second aspect and the first possible implementation, in a second possible implementation, before the packaging the PCB and the power component, and exposing the more than two pins outside the packaged module, the method further includes:

opening the PCB between the more than two pins, to dispose a sprue.

With reference to the second aspect and the first possible implementation, in a third possible implementation, the opening the PCB between the more than two pins, to dispose a sprue includes:

There is one sprue, or there may be a plurality of left and right symmetric sprues, where the plurality of left and right symmetric sprues include two or more sprues.

With reference to the second aspect and the first possible implementation, in a fourth possible implementation, before the packaging the PCB and the power component, and exposing the more than two pins outside the packaged module, the method further includes:

disposing a heat-resistant film on the pin, to prevent the pin from being damaged in a packaging process.

With reference to the second aspect and the first possible implementation, in a fifth possible implementation, after the packaging the PCB and the power component, and exposing the more than two pins outside the packaged module, the method further includes:

cutting the packaged module based on a function or a structure of the power component, and cutting, into at least two independent sub-packaged modules, the power component together with a pin electrically connected to the power unit, where each of the at least two independent sub-packaged modules includes at least one pin exposed outside the packaged sub-module.

According to the packaged module provided in the first aspect and the method for preparing the packaged module provided in the second aspect, the packaged module is disposed in a PCB-pinout manner, to resolve a problem in the conventional technology that a volume of the packaged module is large and a pin soldering process of the packaged module is complex, so that the packaged module has a small volume, and a pin disposing process is simple.

DESCRIPTION OF EMBODIMENTS

The following clearly describes technical solutions in embodiments of the present disclosure with reference to accompanying drawings in the embodiments of the present disclosure. It is clear that the described embodiments are merely some but not all of the embodiments of the present disclosure. All other embodiments obtained by a person of ordinary skill in the art based on the embodiments of the present disclosure without creative efforts shall fall within the protection scope of the present disclosure.

The embodiments of the present disclosure provide a packaged module and a method for preparing the packaged module. The packaged module and the method for preparing the packaged module are used in a scenario of a communications power supply. The packaged module resolves, according to the PCB-pinout based packaging method, a problem in the conventional technology that a volume of the packaged module is large and a pin soldering process of the packaged module is complex, so that the packaged module has a small volume, and a disposing process of a pin that is exposed outside the packaged module is simplified.

Figure 2:
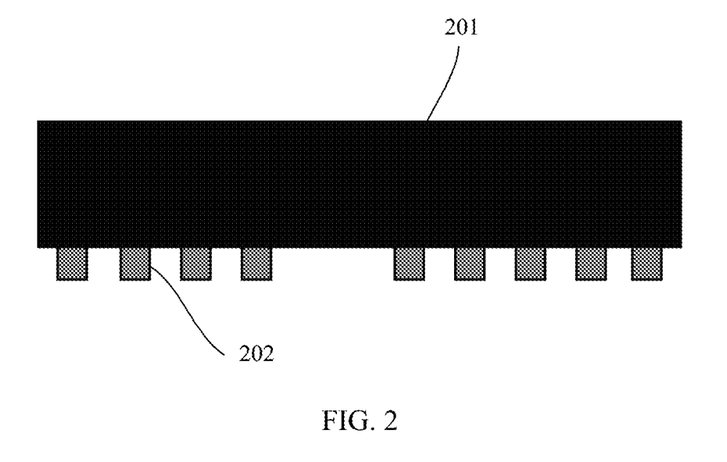
FIG. 2 is a schematic structural diagram of a packaged module according to an embodiment of this application.

FIG. 2 is a schematic structural diagram of a PCB-pinout based packaged module, including a packaged module 201 and a pin 202 that is exposed outside the packaged module.

The packaged module includes a PCB and a power component, the PCB has a first surface and a second surface that are disposed opposite to each other, and the power component is disposed on the first surface or the second surface of the PCB.

The power component performs communication connection with a pin located on one side of the first surface or one side of the second surface of the PCB through surface-layer copper of the PCB.

The pin located on one side of the first surface or one side of the second surface of the PCB is a surface-layer copper etching pattern that is located on the PCB and that is exposed outside the packaged module.

Figure 3:
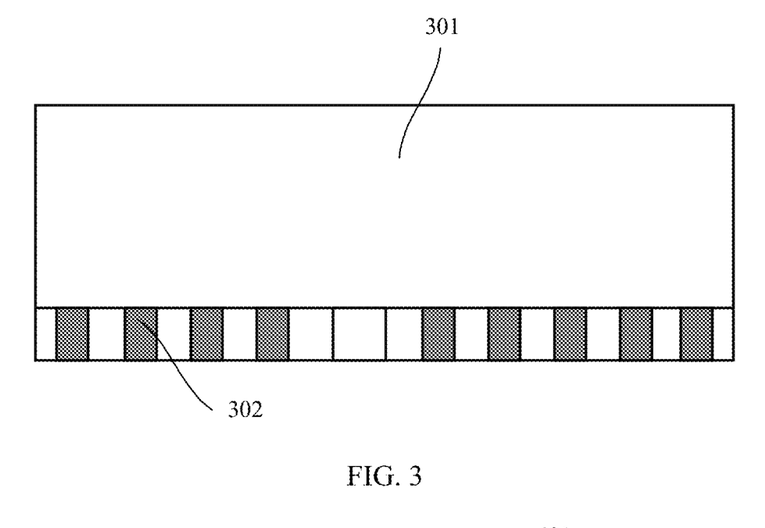
FIG. 3 is a schematic diagram of a PCB-pinout based structure inside a packaged module according to an embodiment of this application.

FIG. 3 is a schematic diagram of a PCB-pinout based structure, including a PCB 301 and a plurality of pins 302. The entire PCB in the figure is a substrate, and the plurality of pins 302 are at least two pins. The plurality of pins 302 are obtained by etching a copper-plated layer on the PCB 301. Before plastic packaging is performed on the packaged module in FIG. 2, a structure of the plastic-packaged module in FIG. 2 is a structure of the pinouts 302 of the PCB 301 shown in FIG. 3. Optionally, various power components are disposed on the PCB 301. Power or signal lead-out points of the power components are connected to the pins 302, and power or signal transmission is performed with an external component of the plastic-packaged module by using the pins 302. An interval is disposed between the plurality of pins 302. When the PCB-pinout based structure is packaged, a part of the PCB 301 on which the plurality of pins 302 are disposed at intervals is entirely exposed outside the packaged module, so that an interval part between the PCB 301 on which the plurality of pins 302 are disposed and the plurality of pins 302 is entirely exposed outside the packaged module. Therefore, various power components disposed on the PCB 301 perform power or signal transmission with the external component of the plastic-packaged module by using the pins 302.

Figure 4:
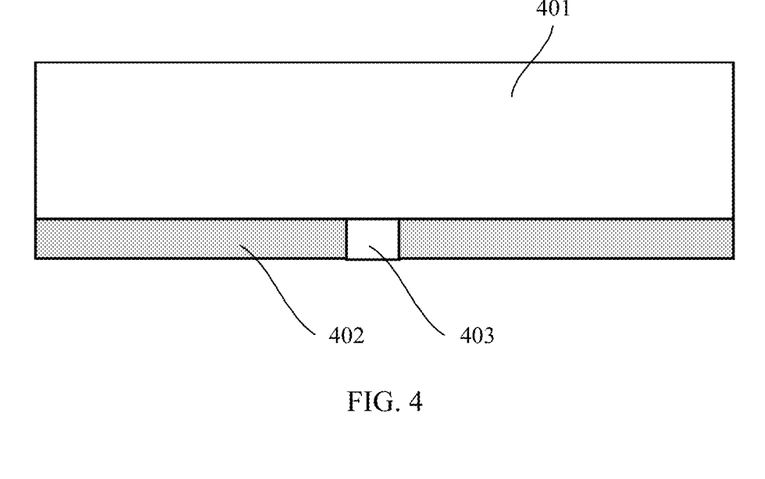
FIG. 4 is a schematic diagram of a PCB-pinout based structure inside a packaged module according to another embodiment of this application.

FIG. 4 is a schematic diagram of another PCB-pinout based structure. On the basis of FIG. 3, a heat-resistant film 402 is added in FIG. 4. The heat-resistant film 402 is disposed on the interval part between the PCB 301 on which the plurality of pins 302 are disposed and the plurality of pins 302 shown in FIG. 3. The heat-resistant film 402 is disposed on the interval part between the PCB 301 on which the plurality of pins 302 are disposed and the plurality of pins 302, to prevent the pins 302 from being damaged in a process of packaging the 404.

Figure 5:
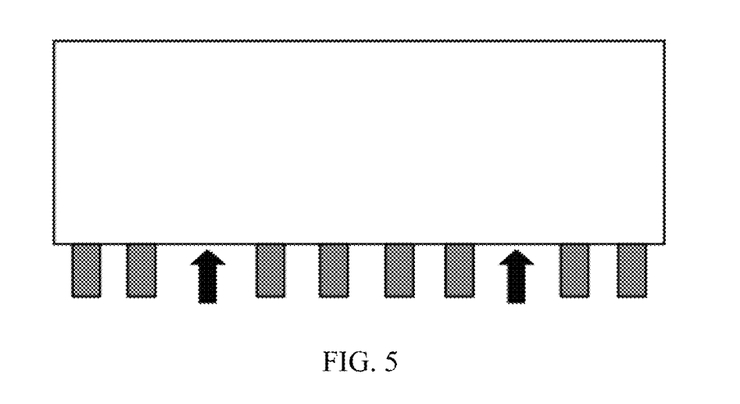
FIG. 5 is a schematic diagram of a PCB-pinout based structure inside a packaged module according to another embodiment of this application.

Further, as shown in FIG. 5, the PCB between two or more pins is provided with an opening to form at least one sprue 403.

Figure 6:
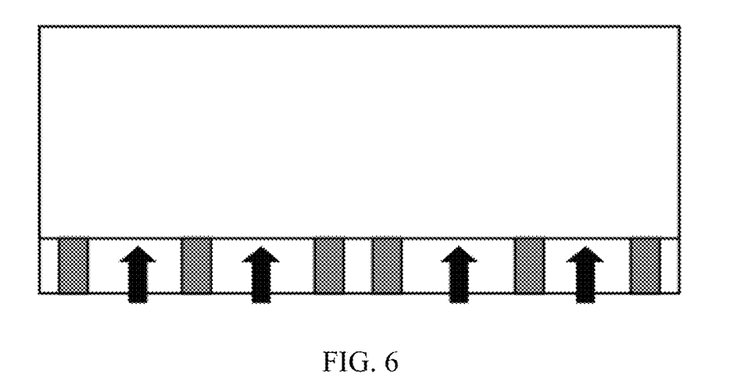
FIG. 6 is a schematic diagram of a PCB-pinout based structure inside a packaged module according to another embodiment of this application.
Figure 7:
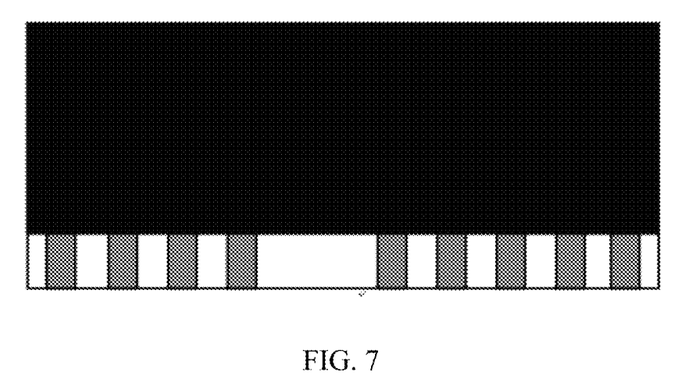
FIG. 7 is a schematic diagram of a PCB-pinout based structure inside a packaged module according to another embodiment of this application.

Further, as shown in FIG. 6, there are two or a plurality of left and right symmetric sprues, and a quantity of the plurality of left and right symmetric sprues are multiples of two. Further, as shown in FIG. 7, there are a plurality of asymmetrical sprues, and a quantity of the plurality of symmetrical and asymmetrical sprues is greater than or equal to two.

Figure 8:
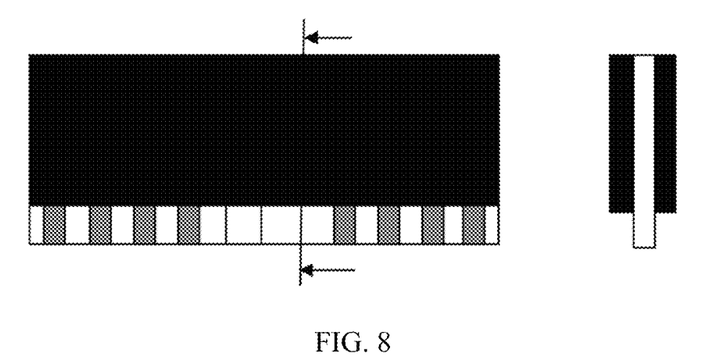
FIG. 8 is a schematic diagram of a PCB-pinout based structure inside a packaged module according to another embodiment of this application.

Further, as shown in FIG. 8, the packaged module may be configured to be cut into at least two independent sub-packaged modules based on a function or a structure of the power component, and each of the at least two independent sub-packaged modules includes at least one pin exposed outside the packaged sub-module.

This application provides the method for preparing the PCB-pinout based packaged module. The packaged module is disposed in a PCB-pinout manner, to resolve the problem in the conventional technology that the volume of the packaged module is large and the pin soldering process of the packaged module is complex, so that the packaged module has a small volume, and the pin disposing process is simple.

Therefore, in a scenario in which the packaged module is applied in the communications power supply, a power module with the foregoing packaging structure has a small volume and is easy to be packaged. This meets a current requirement for miniaturization of a communications power supply packaged module, and improves power density of the communications power supply packaged module.

Figure 9:
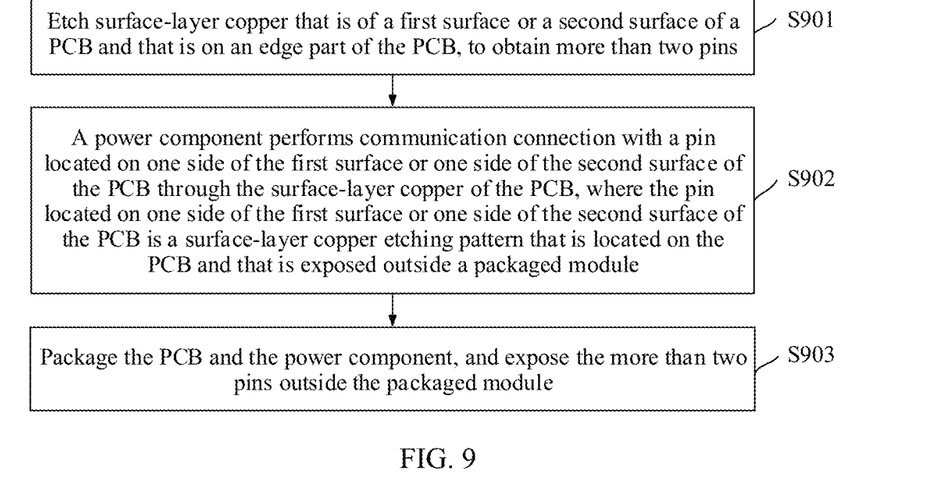
FIG. 9 is a flowchart of a method for preparing a packaged module according to another embodiment of this application.

FIG. 9 shows a method for preparing any packaged module in the foregoing embodiments according to an embodiment of this application. A method for manufacturing a PCB-pinout based packaged module includes the following steps.

Step S901: Etch surface-layer copper that is of a first surface or a second surface of a PCB and that is on an edge part of the PCB, to obtain more than two pins.

The first surface and the second surface of the PCB are disposed opposite to each other on the PCB. The PCB is of a plate structure. The first surface and the second surface are two opposite surfaces of the PCB and are two surfaces with a largest area in external surfaces of the PCB. The first surface or the second surface of the PCB is used to dispose a power component.

Step S902: The power component performs communication connection with a pin located on one side of the first surface or one side of the second surface of the PCB through surface-layer copper of the PCB, where the pin located on one side of the first surface or one side of the second surface of the PCB is a surface-layer copper etching pattern that is located on the PCB and that is exposed outside the packaged module.

Specifically, the power component is disposed on the first surface or the second surface of the PCB, to transfer a signal or power of the power component to the pin. The signal or power is transferred to the pin through the surface-layer copper of the PCB. The pin is a pattern obtained by etching the surface-layer copper of the PCB, and the pin is configured to connect to a circuit or a component outside the packaged module to perform power or signal transmission.

Step S903: Package the PCB and the power component, and expose the more than two pins outside the packaged module.

In a packaging process, only the PCB and the components disposed on the PCB are packaged, and the pin is not packaged. In this way, a volume of the PCB packaged module may be reduced, and power density of the packaged module may be improved. In addition, the pin is also disposed for the packaged module. Therefore, there is no need to reserve or dispose, for the packaged module, a signal or power lead-out point of the power component on the PCB during packaging, there is no need to develop and manufacture an independent pin, and there is no need to solder the independent pin to the signal or power lead-out point of the power component. This not only simplifies the packaging process and reduces the volume of the packaged module, but also eliminates the need to develop and manufacture the independent pin and the need to solder the independent pin to the signal or power lead-out point of the power component.

This application provides the method for preparing the PCB-pinout based packaged module. The packaged module is disposed in a PCB-pinout manner, to resolve a problem in the conventional technology that the volume of the packaged module is large and the pin soldering process of the packaged module is complex, so that the packaged module has a small volume, and a pin disposing process is simple.

Figure 10:
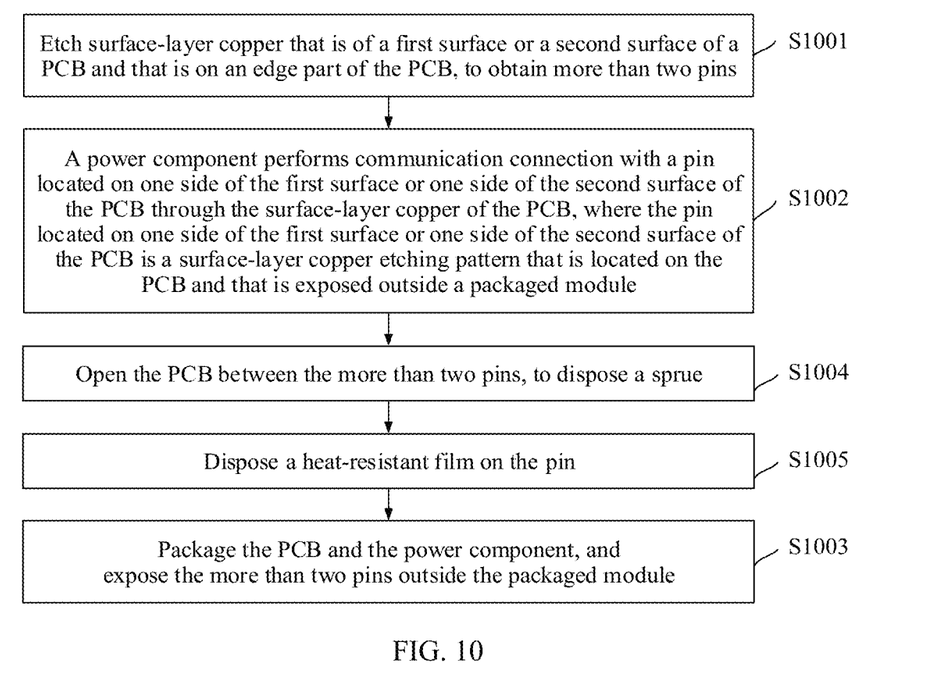
FIG. 10 is a flowchart of a method for preparing a packaged module according to another embodiment of this application.

FIG. 10 shows a method for preparing any packaged module in the foregoing embodiments according to an embodiment of this application. A method for manufacturing a PCB-pinout based packaged module includes the following steps.

Step S1001: Etch surface-layer copper that is of a first surface or a second surface of a PCB and that is on an edge part of the PCB, to obtain more than two pins.

The first surface and the second surface of the PCB are disposed opposite to each other on the PCB. The PCB is of a plate structure. The first surface and the second surface are two opposite surfaces of the PCB and are two surfaces with a largest area in external surfaces of the PCB. The first surface or the second surface of the PCB is used to dispose a power component.

S1002: The power component performs communication connection with a pin located on one side of the first surface or one side of the second surface of the PCB through surface-layer copper of the PCB, where the pin located on one side of the first surface or one side of the second surface of the PCB is a surface-layer copper etching pattern that is located on the PCB and that is exposed outside the packaged module.

Specifically, the power component is disposed on the first surface or the second surface of the PCB, to transfer a signal or power of the power component to the pin. The signal or power is transferred to the pin through the surface-layer copper of the PCB. The pin is a pattern obtained by etching the surface-layer copper of the PCB, and the pin is configured to connect to a circuit or a component outside the packaged module to perform power or signal transmission.

Step S1003: Package the PCB and the power component, and expose the more than two pins outside the packaged module.

In a packaging process, only the PCB and the components disposed on the PCB are packaged, and the pin is not packaged. In this way, a volume of the PCB packaged module may be reduced, and power density of the packaged module may be improved. In addition, the pin is also disposed for the packaged module. Therefore, there is no need to reserve or dispose, for the packaged module, a signal or power lead-out point of the power component on the PCB during packaging, there is no need to develop and manufacture an independent pin, and there is no need to solder the independent pin to the signal or power lead-out point of the power component. This not only simplifies the packaging process and reduces the volume of the packaged module, but also eliminates the need to develop and manufacture the independent pin and the need to solder the independent pin to the signal or power lead-out point of the power component.

Further, in step S1004, before the packaging the PCB and the power component, and exposing the more than two pins outside the packaged module, the method further includes: opening the PCB between the more than two pins, to dispose a sprue.

Further, in step S1005, before the packaging the PCB and the power component, and exposing the more than two pins outside the packaged module, the method further includes:

disposing a heat-resistant film on the pin, to prevent the pin from being damaged in the packaging process. Specifically, in the apparatus in FIG. 3 and the apparatus in FIG. 4 that correspond to the methods, the heat-resistant film 402 is added. In FIG. 3, the heat-resistant film 402 is disposed on the interval part between the PCB 301 on which the plurality of pins 302 are disposed and the plurality of pins 302. The heat-resistant film 402 is disposed on the interval part between the PCB 301 on which the plurality of pins 302 are disposed and the plurality of pins 302, to prevent the pins 302 from being damaged in a process of packaging the 404.

Further, the packaging the PCB and the power component, and exposing the more than two pins outside the packaged module specifically includes:

packaging the PCB and the power component, and exposing, entirely outside the packaged module, the surface-layer copper etching pattern that is located on the PCB and that is exposed outside the packaged module, where the surface-layer copper etching pattern that is exposed outside the packaged module is more than two pins of the packaged module.

Further, the opening the PCB between the more than two pins, to dispose a sprue includes: disposing one sprue, or disposing a plurality of left and right symmetric/asymmetric sprues.

Further, before the packaging the PCB and the power component, and exposing the more than two pins outside the packaged module, the method further includes:

disposing a heat-resistant film on the pin, to prevent the pin from being damaged in the packaging process. Specifically, the heat-resistant film 402 is added. In FIG. 3, the heat-resistant film 402 is disposed on the interval part between the PCB 301 on which the plurality of pins 302 are disposed and the plurality of pins 302. The heat-resistant film 402 is disposed on the interval part between the PCB 301 on which the plurality of pins 302 are disposed and the plurality of pins 302, to prevent the pins 302 from being damaged in a process of packaging the 404.

Further, after the packaging the PCB and the power component, and exposing the more than two pins outside the packaged module, the method further includes: cutting the packaged module based on a function or a structure of the power component, and cutting, into at least two independent sub-packaged modules, the power component together with a pin electrically connected to the power unit, where each of the at least two independent sub-packaged modules includes at least one pin exposed outside the packaged sub-module.

The method for preparing the PCB-pinout based packaged module is used. The packaged module is disposed in a PCB-pinout manner, to resolve a problem in the conventional technology that the volume of the packaged module is large and a pin soldering process of the packaged module is complex, so that the packaged module has a small volume, and a pin disposing process is simple.

Obviously, a person of ordinary skill in the art can make various modifications and variations to the embodiments of the present disclosure without departing from the spirit and scope of the present disclosure. The present disclosure is intended to cover these modifications and variations provided that these modifications and variations fall within the scope of protection defined by the following claims and their equivalent technologies.

The invention claimed is:

1. A PCB-pinout based packaged module, comprising:
a printed circuit board (PCB) having a first surface and a second surface disposed opposite the first surface; and
a power component disposed on the first surface or the second surface of the PCB;
wherein the power component performs communication connection with a pin located on one side of the first surface or one side of the second surface of the PCB through surface-layer copper of the PCB; and
wherein the pin located on one side of the first surface or one side of the second surface of the PCB is a surface-layer copper etching pattern that is located on the PCB and that is exposed outside the packaged module; and
wherein there are two or more pins, and the PCB between the two or more pins is provided with an opening to form at least one sprue.

2. The packaged module according to claim 1, wherein the packaged module consists of one sprue.

3. The packaged module according to claim 1, wherein the packaged module includes a plurality of left and right symmetric sprues.

4. The packaged module according to claim 1, wherein the surface-layer copper etching pattern of the pin is entirely exposed outside the packaged module.

5. The packaged module according to claim 4, wherein a heat-resistant film is disposed on the pin.

6. The packaged module according to claim 4, wherein the packaged module is a communications power supply packaged module.

7. The packaged module according to claim 4, wherein the packaged module is cut into at least two independent sub-packaged modules based on a function or a structure of the power component, and each of the at least two independent sub-packaged modules comprises at least one pin exposed outside the independent sub-packaged module.

8. A method for manufacturing a PCB-pinout based packaged module, comprising:
etching surface-layer copper that is of a first surface or a second surface of a printed circuit board (PCB) and that is on an edge part of the PCB, to obtain more than two pins;
performing, by a power component, communication connection with a pin located on one side of the first surface or one side of the second surface of the PCB through the surface-layer copper of the PCB;
packaging the PCB and the power component, and exposing the more than two pins outside a packaged module; and
before the packaging the PCB and the power component, and exposing the more than two pins outside the packaged module, the method further comprises:
opening the PCB between the more than two pins, to dispose a sprue.

9. The method according to claim 8, wherein the packaging the PCB and the power component, and exposing the more than two pins outside the packaged module comprises:
packaging the PCB and the power component, wherein the sprue is configured to connect a packaging material to two sides of the PCB in a packaging process, wherein the two sides of the PCB comprise one side on which the first surface is located and one side on which the second surface is located, and the more than two pins are exposed outside the packaged module.

10. The method according to claim 9, wherein before the packaging the PCB and the power component, and exposing the more than two pins outside the packaged module, the method further comprises:
disposing a heat-resistant film on the pin.

11. The method according to claim 10, wherein after the packaging the PCB and the power component, and exposing the more than two pins outside the packaged module, the method further comprises:
cutting the packaged module based on a function or a structure of the power component, and cutting, into at least two independent sub-packaged modules, the power component together with a pin electrically connected to the power device, wherein each of the at least two independent sub-packaged modules comprises at least one pin exposed outside the sub-packaged module.

* * * * *

UNITED STATES PATENT AND TRADEMARK OFFICE
CERTIFICATE OF CORRECTION

PATENT NO. : 11,641,072 B2
APPLICATION NO. : 17/327297
DATED : May 2, 2023
INVENTOR(S) : Pan et al.

It is certified that error appears in the above-identified patent and that said Letters Patent is hereby corrected as shown below:

On the Title Page

Page 2: item (56) U.S. Patent Documents, Column 1, Line 1: "Hosier, Sr." should read -- Hosler, Sr. --.

Signed and Sealed this
Twenty-second Day of August, 2023

Katherine Kelly Vidal
*Director of the United States Patent and Trademark Office*